METHOD AND COMPOSITION FOR AUTOCATALYTICALLY DEPOSITING COPPER

Filed May 27, 1964

INVENTOR.
HENRY JACKSON
BY
Seghrue, Rothwell, Mion & Zinn
ATTORNEYS

United States Patent Office 3,436,233

Patented Apr. 1, 1969

3,436,233

METHOD AND COMPOSITION FOR AUTOCATALYTICALLY DEPOSITING COPPER

Henry Jackson, Vestal, N.Y., assignor to International Business Machines Corporation, New York, N.Y., a corporation of New York Filed May 27, 1964, Ser. No. 370,504
Int. Cl. C09d 5/08; B44d 1/20
U.S. Cl. 106—1 16 Claims

ABSTRACT OF THE DISCLOSURE

A composition for stabilizing electroless copper plating solutions comprising an alkali metal carbonate or bicarbonate, an alkali metal thiocyanate, a sulphur containing compound and optionally a wetting agent and an alkali metal thiosulphate.

This invention relates to the electroless deposition of copper films onto a substrate.

In recent years, there has been considerable interest in the metallizing of nonconductive substrates by the autocatalytic deposition of a copper film. Various methods and compositions, usually relying upon the reduction of an aqueous solution of a copper salt, have been suggested by the prior art.

In his book, Metallizing of Plastics (1960), Harold Narcus discusses several such methods. The methods discussed by Narcus consist of activating or seeding the substrate followed by the deposition of a copper film thereon. The substrate to be coated is cleaned and then sensitized by immersing it in an aqueous hydrochloric acid solution of titanous chloride. Following this, the substrate is dipped in an aqueous hydrochloric solution of palladium chloride, which results in the deposition of an invisible palladium film on the surface of the substrate. The presence of the palladium film accelerates the formation of metallic copper. The sensitized substrate is then immersed in the electroless copper plating solution.

The electroless solution used by Narcus comprises an aqueous solution of copper sulfate, nickel chloride, hydrazine sulfate, sodium chloride, Rochelle salts and sodium carbonate. By contacting the substrate with this solution for approximately 45 minutes, a film of metallic copper is formed on the surface.

Other similar methods and compositions for the electroless deposition of copper films are disclosed in U.S. Patent Nos. 2,454,160, Narcus, and 2,874,072, Cahill et al.

Electrolessly deposited copper films have many uses and are widely employed as underlayers upon which additional metallic films are deposited by electrolytic means. This technique is particularly important in the plating of conductive patterns and through-holes of printed circuit boards.

Through-hole plating refers to the method of electrically connected multiplanar printed circuits. Multiplanar printed circuits are those having conductor patterns lying in a plurality of distinct planes. The conductor patterns are connected by depositing metal in holes which are perpendicular to the planes of the circuits. The through-holes may be produced by autocatalytically depositing a copper film within the hole and then electrolytically depositing additional copper on the preliminary electroless copper film. The commercial feasibility of such multiplanar printed circuits depends, in part, on a reliable and inexpensive method for the electroless deposition of copper.

The electroless copper plating of nonmetallic substrates, although potentially very attractive, has not received unqualified commercial acceptance. Among the reasons for this is the fact that conventional electroless copper solutions have a short useful life, usually about 10 hours. Exhaustion of the solutions necessitates costly delays while the solutions are replenished.

Accordingly, it is an object of this invention to provide a composition for stabilizing electroless copper plating baths.

Furthermore, it is an object of this invention to provide a stabilized electroless plating bath for the deposition of bright copper films.

Additionally, it is an object of this invention to provide a method for reliably and inexpensively depositing bright copper films by an autocatalytic reaction.

The manner in which the foregoing objects and other objects and advantages are achieved by the present invention will be apparent from the following detailed description of the invention considered in the light of the accompanying drawing.

Figure 1:
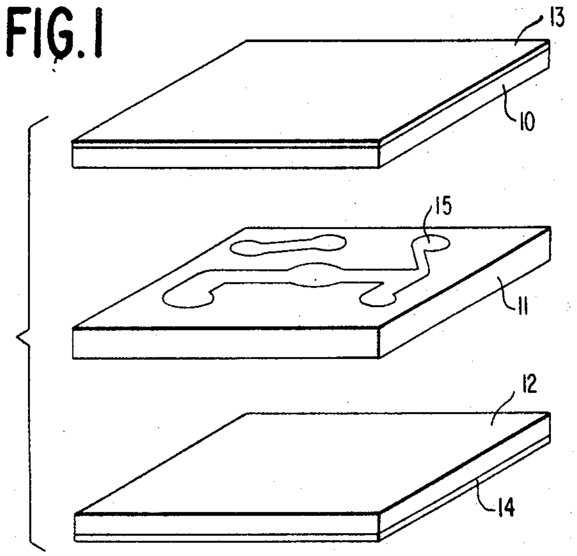
FIG. 1 is a schematic diagram of a multi-planar printed circuit board which may be coated by the method of this invention.

The present invention comprises a stabilizing composition for addition to electroless copper plating baths. Basically, the stabilizing composition is composed of five components in an aqueous vehicle. The ingredients of the composition comprise a wetting agent, an alkali metal carbonate or bicarbonate, an alkali metal thiosulfate, an alkali metal thiocyanate, and an active sulfur containing compound which may be thiourea or a mercaptan. The ingredients of the stabilizing composition may be mixed together in water and the resulting aqueous compositions may be stored for up to 3 or 4 months and used as needed.

The present invention further comprises electroless copper plating baths incorporating the stabilizing composition. The stabilizing compositions of this invention can stabilize all electroless copper plating solutions of the type comprising an aqueous solution of a copper salt and a reducing agent therefor. The addition of the stabilizing composition to the electroless solution increases the useful life of the solution from a few hours to several weeks. This greatly reduces the cost of electroless copper processing since it was necessary in the past to discard a large amount of unused reagent-grade chemicals because of the degradation of the electroless copper bath. By providing a stable electroless copper system, the cost of handling and maintaining the system is also reduced. The stabilizing composition of this invention can be easily prepared from readily available chemicals and can be stored until used.

Besides increasing the useful life of the electroless solution, it has been found that the stabilizing compositions also increase the brightness of the copper deposit, improve the crystal structures of the copper, and deposits a more even copper film.

The present invention further comprises the electroless deposition of bright, smooth copper films from baths incorporating the present stabilizing compositions. The general steps in electroless copper plating methods comprise depositing a film of an activating metal, such as palladium, gold or silver, onto the base to be plated and then immersing the base in the stabilized electroless copper solution. In certain instances, the electroless plating operating may then be followed by the electrolytic deposition of a superimposed copper film.

The stabilizing compositions of the invention will now be described in more detail. As mentioned above, these compositions contain a wetting and dispersing agent.

Various wetting and dispersing agents well known in the prior art may be used for this purpose. The preferred wetting agents are Tamol SN and Tamol 731, both manufactured by Rohm and Haas. Tamol SN is the neutral sodium salt of a condensed aryl sulfonic acid. It is supplied in the form of a finely divided free-flowing powder. A typical analysis of Tamol SN reveals the following composition:

| | |
|---|---|
| Solids content ____________percent minimum__ | 93 |
| pH, 2% solution ____________________________ | 8.7–9.7 |
| Sodium sulfate (amperometric titration) ______________percent__ | 7–9 |
| Sulfated ash _____________percent maximum__ | 35 |
| Moisture ______________________do____ | 7 |
| Iron as $Fe_2O_3$ (o-phenanthroline method) ______________________do____ | 0.010 |
| Alkalinity, as $Na_2CO_3$ _______________do____ | 0.8 |
| Water insolubles ____________________do____ | 0.3 |
| Solubility appearance, 12% aqueous solution___ | Clear |

Another preferred wetting agent is Tamol 731. Tamol 731 is the sodium salt of a carboxylated polyelectrolyte. Also suitable for use in the stabilizing composition of this invention is Tamol L, supplied by Rohm and Haas, which is the sodium salt of a condensed aryl sulfonic acid. Generally, any wetting agent which is compatible with the alkaline system and which does not promote foaming or frothing may be used, with anionic surfactants being the preferred class. Thus, the Daxad wetting agents, supplied by W. R. Grace & Co., such as Daxad 11KLS, Daxad 21, Daxad 22, and Daxad 23, are suitable. These are salts of alkyl naphthalene sulfonic acids.

The stabilizing composition of this invention further contains an alkali metal carbonate or bicarbonate. This compound itself acts as a stabilizer for the stabilizing composition and also increases the plating speed of the electroless copper solution. Any alkali metal carbonate or bicarbonate may be used for this purpose. Thus, for example, lithium carbonate, sodium carbonate, potassium carbonate, lithium bicarbonate, sodium bicarbonate, potassium bicarbonate and the like are all suitable. Due to the relative costs and availability of these materials, sodium carbonate, potassium carbonate and potassium bicarbonate are the preferred ingredients.

Another essential ingredient of the stabilizing composition is an alkali metal thiosulfate. These materials are believed to increase the efficiency of the electroless copper bath and improve the luster of the deposited copper film by reducing the size of the copper particles. The alkali metal thiosulfate may be chosen from any of the well known alkali metal thiosulfates, such as lithium thiosulfate, sodium thiosulfate, potassium thiosulfate, and the like. In the preferred embodiment, the thiosulfate is either potassium thiosulfate or sodium thiosulfate. For reasons of economy, when sodium thiosulfate is used, it is most practical to employ the readily available pentahydrate form.

The alkali metal thiocyanate constituent of the composition is thought to improve the stability and efficiency of the electroless copper bath. All of the alkali metal thiocyanates are suitable, including, for example, lithium thiocyanate, sodium thiocyanate, potassium thiocyanate and the like. The preferred thiocyanate is either sodium or potassium thiocyanate.

An important component of the stabilizing composition is the organic sulfur compound. When an organic sulfur compound, such as thiourea or a mercaptan, is mixed with the other ingredients of this composition and added to an electroless copper solution the useful life of the electroless solution is increased from a few hours up to three weeks with extremely good plating results. Moreover, the brightness, crystal structure and leveling of the electroless deposit are improved. Mercaptans have been found to be generally acceptable as the organic sulfur constituent. Examples of suitable mercaptan compounds are heterocyclic mercaptans, such as 2,5-dimercapto-1,3,4-thiadiazole, 8 mercaptopurine and 2 mercaptothiazoline; mercapto mono- and di-carboxylic acids, such as thiomalic acid, thiolactic acid, α,α-dimercapto adipic acid, dithioglyceric acid, dithiotartic acid, 3-mercaptopropionic acid and thioglycolic acid; mercapto alcohols, such as 1-thioglycerol and 2-mercaptoethanol; salts of mercapto carboxylic acids, such as ammonium thioglycolate, diammonium dimercaptoadipate and sodium thioglycolate; and esters of mercapto carboxylic acids, such as glycol dimercaptoacetate. Mixtures of two or more of these materials, such as a mixture of 8-mercaptopurine and thiomalic acid, may be used. The only limitation upon the sulfur-containing component chosen is that it must be water soluble or alkali soluble and capable of being used in an alkaline aqueous system. This is to insure that the material be compatible with the electroless copper solution. It has been found that water and alkali soluble organic sulfur compounds, not containing the mercaptan grouping, may also be used in this invention. Thiourea has already been mentioned for this purpose. Another suitable compound is thiodiglycolic acid.

$CH_2COOH$
|
S
|
$CH_2COOH$

The addition composition of this invention is prepared by simply adding the ingredients to water. When the organic sulfur compound is not water soluble, but only alkali soluble, it is best to first dissolve it in a small amount of base, such as 1 to 2 ml. of 1 molar sodium hydroxide. The solution of the organic sulfur compound in the aqueous base is then added to the solution of the other ingredients. In a preferred embodiment of this invention, the pH of the additive composition will be between 10.5 and 11. When the stabilizing composition of this invention is stored in a tightly closed plastic container and maintained at ambient temperature it is stable over several months.

As previously noted, the additive compositions of this invention can be used to stabilize all electroless copper solutions of the type comprising a copper salt and a reducing agent for the salt. Generally, these electroless compositions are formed by first preparing separate reducing and copper salt solutions which are mixed together at the point of use. The stabilizing composition of this invention will be added to the mixture of the copper salt and reducing solution.

A preferred electroless copper solution is that formed by mixing a solution of copper sulfate, formaldehyde and distilled water with a solution of nickel chloride, sodium hydroxide, Rochelle salts, sodium carbonate, and distilled water. These solutions can be prepared several months in advance of their ultimate use. When they are mixed together, a small amount of the additive solution, usually about 1 to 2 cc. per gallon, is added thereto. The electroless copper soluttion is then used to metallize a suitable substrate. During the metallization process, which may run continuously for several weeks, additional amounts of stabilizer may be added to the working solution. By following this procedure, the electroless copper solution may be used for periods far in excess of those possible by prior techniques.

Various other electroless copper solutions may be used with the additive of this invention. For example, Cuposit Copper Mix 3, Cuposit Copper Mix 48 and Cuposit Copper Mix 328, supplied by the Shipley Company, have all been stabilized with the additives of this invention. It is not essential that the electroless solution contain a nickel salt. However, it has been found that the presence of nickel chloride in the electroless solution improves the ductility of the deposited copper film and prevents blistering when thick coatings are deposited. When nickel chloride is used, the deposited film will contain traces of metallic nickel.

The following examples will serve to illustrate certain preferred embodiments of this invention and will assist a more complete understanding of the invention.

EXAMPLE 1

A addition agent for stabilizing electroless copper solutions is prepared by adding one gram of Tamol SN, one gram of sodium carbonate (Reagent Grade $Na_2Co_3$), one gram of sodium thiosulfate pentahydrate (reagent-grade $Na_2S_2O_3.5H_2O$), and one gram of sodium thiocyanate (reagent-grade NaCNS), to one liter of distilled water. The aqueous compositions is thoroughly mixed. Then, 0.0025 gram of 2,5-dimercapto, 1,3,4-thiadiazole (highest purity $C_2H_2N_2S_3$) is dissolved in 2 ml. of 1 molar sodium hydroxide and is added to the foregoing solution. The pH of the resulting aqueous composition is about 10.5. The composition is poured into a plastic container and is tightly sealed. It is then stored at room temperature and may be maintained in this manner until used.

A series of experiments conducted with stabilizing compositions comprising the ingredients of the composition of Example 1 confirm that the preferred range of amounts of each ingredient is as shown in Table I. The range of ingredients shown in Table I is particularly desirable for stabilizing the electroless solution of Example 32.

TABLE I [1]

| Component | Lower limit | Upper limit |
|---|---|---|
| Tamol SN | 1.00 | 1.20 |
| Sodium carbonate | 1.00 | 2.00 |
| Sodium thiosulfate pentahydrate | 1.00 | 1.50 |
| Sodium thiocyanate | 1.00 | 1.20 |
| 2,5-dimercapto-1,3,4-thiadiazole | 0.0020 | 0.0050 |

[1] All amounts are in grams of component per liter of water in the additive composition.

Other additive compositions containing 2,5-dimercapto, 1,3,4-thiadiazole are prepared as described in Examples 2 through 7.

EXAMPLE 2

An addition agent for stabilizing electroless copper solutions is prepared as in Example 1, except that 1.0 gram of Tamol 731 is substituted for the one gram of Tamol SN used in Example 1. The resulting addition agent can be stored, under the conditions specified in Example 1, until use.

EXAMPLE 3

By substituting 1.0 gram of potassium carbonate for the one gram of sodium carbonate used in Example 1, an addition agent, which will stabilize electroless copper solutions for long periods of time, is prepared.

EXAMPLE 4

To 1 liter of distilled water is added 1.20 grams of Tamol 731, 2.00 grams of potassium bicarbonate, one gram of sodium thiosulfate pentahydrate, and one gram of sodium thiocyanate. The mixture of constantly stirred during the addition. Following this, 0.0040 gram of 2,5-dimercapto, 1,3,4-thiadiazole dissolved in 2 mls. of one molar sodium hydroxide is added to the foregoing solution. The pH of the resulting composition is then poured into a plastic container, tightly sealed, and stored at room temperature for three months. After this time, it is found that the solution is still effective as a stabilizer for electroless copper plating solutions.

EXAMPLE 5

An addition agent is prepared in a manner identical with that set forth in Example 1, except that 1.30 grams of potassium thiosulfate is substituted for the sodium thiosulfate used in Example 1. An addition agent which will stabilize electroless copper plating solutions for up to 26 days is obtained.

EXAMPLE 6

An addition agent is prepared by the technique disclosed in Example 1, except that 1.20 grams of potassium thiocyanate is substituted for the sodium thiocyanate used in Example 1. An addition agent which can be stored for several months with no detrimental effects and can effectively stabilize electroless copper plating solutions, is obtained.

EXAMPLE 7

One gram of Tamol SN, 1.8 grams of potassium carbonate, 1.4 grams of potassium thiosulfate and 1.2 grams of sodium thiocyanate are added to one liter of distilled water with constant stirring. To the resulting solution is added 0.0020 gram of 2,5-dimercapto, 1,3,4-thiadiazole. The pH of the resulting composition is 10.7. The composition is then stored in a tightly sealed plastic container until use.

Addition agents containing thiourea as the organic sulfur compound can be prepared as set forth in Examples 8 through 15. It has been found that thiourea when used alone will serve to increase the useful life of the electroless solution. However, when this is done, the deposited copper films are dull and have poor leveling qualities. When thiourea is mixed with the other ingredients of the stabilizing compositions of this invention, both high stability and a high-quality copper film are obtained.

EXAMPLE 8

An additive for stabilizing electroless copper solutions is prepared by adding 1 gram of Tamol SN, 1 gram of sodium carbonate, 1 gram of sodium thiosulphate pentahydrate, and 1 gram of sodium thiocyanate to a vessel containing 1 liter of distilled water. The resulting formulation is stirred for ten minutes and then 0.009 gram of thiourea is added thereto. The resulting composition is stored in a plastic container, which is tightly sealed, until it is used.

It has been found that the concentration of thiourea used does not dictate the length of time which an electroless solution will be stabilized by this composition nor does it control the quality of the copper film produced. In practice, it has been found desirable to use thiourea concentrations of from between 0.0020 and 0.0152 gram of thiourea per liter of water in the additive composition. The preferred amount of the ingredients in compositions of the type prepared in Example 8 are set forth in Table II.

TABLE II [1]

| Component | Lower limit | Upper limit |
|---|---|---|
| Tamol SN | 1.00 | 1.10 |
| Sodium carbonate | 1.00 | 2.00 |
| Sodium thiosulfate pentahydrate | 1.00 | 1.20 |
| Sodium thiocyanate | 1.00 | 1.20 |
| Thiourea | 0.0090 | 0.0150 |

[1] All amounts are in grams per liter of water in the additive composition.

EXAMPLE 9

An additive composition is prepared by the method set forth in Example 8 except that 1.10 grams of Tamol 731 is substituted for the Tamol SN used in Example 8. The composition produced can be used to effectively stabilize electroless plating solutions and to obtain a high quality copper film.

EXAMPLE 10

By substituting 2.0 grams of potassium carbonate for the sodium carbonate used in Example 8, an additive composition having desirable properties is obtained. The substitution of the potassium carbonate for the sodium carbonate does not detrimentally affect the properties of the stabilizing solution and thus these materials may be considered as equivalents for this purpose.

EXAMPLE 11

1.0 gram of Tamol 731, 1.8 grams of potassium bicarbonate, 1 gram of sodium thiosulphate pentahydrate, and 1 gram of sodium thiocyanate are added to 1 liter of distilled water with constant agitation. To the resulting solution there is added 0.0150 gram of thiourea. The resulting composition can be stored and used to stabilize electroless copper solutions.

EXAMPLE 12

An addition agent is prepared in the manner set forth in Example 8 except that 1.0 gram of potassium thiosulphate is substituted for the sodium thiosulphate used in Example 8. A composition is obtained which can be used to stabilize electroless copper plating solutions for long periods of time.

EXAMPLE 13

By substituting 1.2 grams of potassium thiocyanate for the sodium thiocyanate used in Example 8 and by preparing the remainder of the composition in a manner identical to that set forth in Example 8, a composition is obtained which can be stored for long periods of time and then used to effectively stabilize electroless copper solutions.

EXAMPLE 14

To a vessel containing 1 liter of deionized water there is added, with constant stirring, 1.20 grams Tamol SN, 2.0 grams potassium carbonate, 1.0 gram potassium thiosulphate, and 1.10 grams of sodium thiocyanate. Stirring is continued for 10 minutes and then 0.01 gram of thiourea is added. The resulting composition is an effective stabilizer for electroless copper plating solutions and when added to a suitable electroless composition results in a media which can be used to deposit bright and level copper films.

The stabilizing compositions provided by this invention may contain more than one organic sulphur compound. For example, a preferred embodiment employs a mixture of 8-mercaptopurine and thiomalic acid, each of which is effective in the absence of the other, as illustrated in Example 15.

EXAMPLE 15

An addition agent is prepared by adding to a vessel containing 1 liter of distilled water, 1 gram of Tamol SN, 0.0013 gram of 8-mercaptopurine ($C_5H_4N_4S$), 0.0015 gram of thiomalic acid ($C_4H_6O_4S$), 1.25 grams sodium thiocyanate, 1.25 grams potassium carbonate·1½ $H_2O$, and 1.25 grams sodium thiosulphate pentahydrate. The mixture of the above six ingredients in the distilled water is thoroughly mixed until the ingredients are dissolved. The pH of the solution is between 10.50 and 11. The resulting solution can then be stored in a tightly closed plastic bottle at room temperature until it is desired to use it. This addition agent is stable over long periods of time.

The relative amounts of each ingredient are not critical. However, it is preferred in practice to use a range of concentrations as set forth in Table III.

TABLE III [1]

| Component | Lower limit | Upper limit |
|---|---|---|
| Tamol SN | 1.00 | 1.50 |
| Sodium thiocyanate | 1.25 | 1.30 |
| $K_2CO_3 \cdot 1\frac{1}{2}H_2O$ | 1.25 | 1.30 |
| Sodium thiosulphate pentahydrate | 1.25 | 1.30 |
| 8-mercaptopurine | 0.0013 | 0.0015 |
| Thiomalic acid | 0.0013 | 0.0015 |

[1] All amounts are in grams of component per liter of water in the additive composition.

EXAMPLE 16

An additive composition is prepared in a manner identical with that set forth in Example 15 except that 1.5 grams of Tamol 731 are substituted for the Tamol SN used in Example 15. This does not affect the properties of the resulting additive composition and a solution suitable for stabilizing electroless copper baths is obtained.

EXAMPLE 17

Similarly, when 1.3 grams of sodium carbonate are substituted for the potassium carbonate used in Example 15, a stabilizing composition of extremely fine properties is obtained.

EXAMPLE 18

An additive composition is prepared by adding 1.0 gram Tamol 731, 1.25 grams potassium bicarbonate, 1.30 grams sodium thiocyanate, 1.27 grams sodium thiosulphate pentahydrate, 0.0013 gram 8-mercaptopurine, and 0.0013 gram thiomalic acid to 1 liter of deionized water. The resulting murky dispersion is thoroughly mixed until the ingredients are dissolved. The resulting solution can then be stored until use. By this method, a stabilizing component for electroless copper baths is obtained.

EXAMPLE 19

The method set forth in Example 15 is followed except that 1.3 grams of potassium thiosulphate is substituted for the sodium thiosulphate used in Example 15. As a stabilizing composition having properties similar to that of Example 15 is obtained, it is thereby established that potassium thiosulphate and sodium thiosulphate are equivalents in this composition.

EXAMPLE 20

By following the procedure set forth in Example 15 with the substitution of 1.25 grams of potassium thiocyanate, for the sodium thiocyanate used in Example 15, a stabilizing composition having essentially the same properties as that formed in Example 15 is obtained. This leads to the conclusion that potassium thiocyanate and sodium thiocyanate are equivalents in this composition.

EXAMPLE 21

An additive composition having the property of increasing the stability of electroless copper solutions and improving the quality of the deposited copper film is obtained by adding to a vessel containing 1 liter of distilled water, 1.50 grams Tamol SN, 1.30 grams potassium carbonate, 1.3 grams potassium thiosulphate, 1.27 grams sodium thiocyanate, 0.0015 gram 8-mercaptopurine, and 0.0013 gram thiomalic acid. The mixture is stirred for 20 minutes at which time all of the ingredients are dissolved. The resulting solution is then poured into a plastic container, tightly sealed, and stored at room temperature until used.

As mentioned above, a vast number of organic sulphur containing compounds are suitable for use in the compositions of this invention. In fact, all organic sulphur containing compounds which have been tried in the stabilizing compositions of this invention have proven suitable. Several of these compositions are set forth in Examples 22 through 31.

EXAMPLE 22

Into a vessel containing one liter of distilled water, there is added, with constant stirring, 1 gram of Tamol SN, 1 gram of potassium bicarbonate, 1 gram of potassium thiosulphate, 1.10 grams sodium thiocyanate, and 0.0015 gram of thiolactic acid ($C_3H_6O_2S$). The composition is then thoroughly stirred until the components dissolve. The resulting solution can be stored for long periods of time and proves to be an effective stabilizing agent for electroless copper solutions.

EXAMPLE 23

A mixture of 1.10 grams Tamol SN, 1 gram potassium carbonate, 1.20 grams sodium thiosulphate pentahydrate, and 1 gram of potassium thiocyanate, is added to 1 liter of deionized water. The resulting mixture is stirred until all of the ingredients have dissolved. To the resulting solution there is added 0.002 gram of 3-mercaptopropionic acid. Stirring is continued for approximately 7 minutes until all of the 3-mercaptopropionic acid has dissolved. The resulting solution exhibits properties similar to those of the addition agent prepared in Example 1.

EXAMPLE 24

A mixture of 1.20 grams Tamol 731, 1.10 grams sodium carbonate, 1.15 grams potassium thiosulphate, and 1 gram of sodium thiocyanate is added to 1 liter of distilled water with constant stirring. After this mixture has dissolved, 0.0013 gram of 1-thioglycerol is added to the resulting solution. Stirring is continued until all of the 1-thioglycerol has dissolved. An aqueous solution which proves to be an effective stabilizer for electroless copper solutions is obtained. This solution can be stored for long periods of time without any detrimental effects.

EXAMPLE 25

To a beaker containing 1 liter of distilled water, there is added 1.5 grams of Tamol 731, 1.3 grams of sodium carbonate, 1.25 grams of sodium thiosulphate pentahydrate, and 1.3 grams of sodium thiocyanate. The resulting mixture is thoroughly stirred and then 0.0018 gram of 2-mercaptoethanol added thereto. Stirring is continued until all of the 2-mercaptoethanol has dissolved. Following this, the resulting solution is poured into a plastic container, tightly sealed, and stored at room temperature until use. It proves to be an effective stabilizer for various electroless copper solutions.

EXAMPLE 26

A mixture of 1.1 grams Tamol 731, 2.0 grams potassium carbonate, 1.5 grams of potassium thiosulphate, and 1.0 gram of potassium thiocyanate is added to 1 liter of distilled water. 0.0015 gram of 2-mercapto thiozoline is dissolved in 1 milliliter of 1 molar sodium hydroxide and then added to the above mixture. The composition is stirred for approximately 15 minutes until all of the ingredients have dissolved. This composition proves to be an effective stabilizer for various electroless copper solutions.

EXAMPLE 27

A stabilizing composition containing thioglycolic acid as the organic sulphur component is prepared as follows:

To a beaker containing 1 liter of distilled water there is added 1.2 grams of Tamol SN, 1.0 gram of potassium bicarbonate, 1.1 grams of sodium thiosulphate pentahydrate, and 1.0 gram of potassium thiocyanate. The resulting composition is then stirred until all of the ingredients have dissolved. Following this, 0.002 gram of thioglycolic acid (mercapto acetic acid) is added thereto. Stirring is continued for 4 minutes until all of the thioglycolic acid has dissolved. This composition proves to be an effective stabilizer for all electroless copper plating solutions of the type comprising a copper salt and a reducing agent.

It can be stored for long periods of time without detrimental effects.

EXAMPLE 28

A stabilizer for electroless copper solutions which utilizes ammonium thioglycolate as the organic sulphur component is prepared as follows:

Into a vessel containing 1 liter of deionized water there is added 1.3 grams of Tamol SN, 1.25 grams of potassium carbonate, 1.3 grams of potassium thiosulphate, and 1.2 grams of potassium thiocyanate. The resulting mixture is thoroughly stirred until all of the ingredients have dissolved. Five to ten minutes of stirring at room temperature is normally sufficient for this purpose. To the resulting solution there is added 0.0013 gram of ammonium thioglycolate and stirring continued for 6 minutes or until all of the ammonium thioglycolate has dissolved. The resulting solution exhibits properties similar to those of the solutions discussed above.

EXAMPLE 29

A stabilizing composition containing sodium thioglycolate is prepared by adding to a vessel containing 1 liter of distilled water, the following ingredients:

1.0 gram of Tamol SN, 1.3 grams of sodium carbonate, 1.25 grams of sodium thiosulphate pentahydrate, 1.0 gram of potassium thiocyanate, and 0.0018 gram of sodium thioglycolate. The resulting mixture is stirred until all of the ingredients have dissolved. This normally takes about 10 minutes. Following this, the resulting composition can be poured into a plastic container which is then tightly sealed and stored until use. It proves to be an effective stabilizer for electroless copper plating solutions.

EXAMPLE 30

A stabilizing composition containing glycol dimercapto acetate is prepared as follows:

Into a beaker containing 1 liter of distilled water there is added 1.0 gram of Tamol 731, 1.0 gram of potassium carbonate, 1.5 grams of sodium thiosulphate pentahydrate, and 1.2 grams of potassium thiocyanate. The resulting mixture is stirred until all of the ingredients have dissolved. This normally takes about 4 minutes. Following this, 0.0015 gram of glycol dimercapto acetate is added thereto. The resulting composition is stirred until all of the glycol dimercapto acetate has dissolved. The resulting composition is an effective stabilizer.

It is not necessary that the organic sulphur compound need contain a thiol grouping. Besides thiourea, which is employed in Examples 8 through 14, various organic sulphide compounds may also be used. An example of this is thiodiglycolic acid.

EXAMPLE 31

A stabilizing composition containing thiodiglycolic acid is prepared as follows:

Into a reaction vessel containing 1 liter of deionized water, there is added a mixture of 1.0 gram Tamol 731, 1.5 grams potassium thiosulphate, 2.0 grams sodium carbonate and 1.2 grams potassium thiocyanate. The resulting aqueous composition is then stirred for 8 minutes until all of the solids have dissolved. At this time, 0.0014 gram of thiodiglycolic acid is added thereto and stirring continued for another 5 minutes. The resulting aqueous solution is then poured into a plastic container, tightly sealed, and stored at room temperature until used. The composition proves to be an effective stabilizer for various electroless copper plating solutions.

The stabilizing compositions of this invention may be used to increase the useful life and improve the plating properties of a variety of electroless copper solutions. In practice, the amount of stabilizing solution added will depend upon the specific electroless copper solution employed. Typical electroless copper solutions, which may be used with the foregoing additives, are prepared in accordance with the following examples.

EXAMPLE 32

An electroless copper working solution is prepared by first preparing separate copper salt and reducing solutions. These solutions will be mixed together and diluted just before use.

The copper salt solution is prepared by adding 170 grams copper sulphate pentahydrate ($CUSO_4 \cdot 5H_2O$) to one gallon of distilled water, which is at a temperature of about 70–80° F. The solution is thoroughly mixed and then 1890 cc. of a 37% aqueous formaldehyde solution is added thereto. The resulting copper salt solution is then stored until use. It can be stored for several months at room temperature.

A reducing solution is prepared by adding to a gallon of distilled water, with constant stirring, 65 grams nickel chlorine hexahydrate ($NiCl_2 \cdot 6H_2O$), 700 grams Rochelle salts ($NaKC_4H_4O_6 \cdot 4H_2O$), 155 grams solid sodium hydroxide, and 70 grams sodium carbonate monohydrate. It is preferable to add the components of this solution serially with constant stirring, allowing 3 to 5 minutes of mixing between the addition of each chemical. After the last ingredient is added, mixing is continued for approximately 30 minutes. After this period, the resulting solution is stored until used.

When it is desired to use the electroless solution, the working solution is prepared by mixing one part of the above copper salt solution, one part of the reducing solution, and six parts of distilled water. The pH of the working solution will be approximately 11.85. In practice, it is best that the pH of the working solution be between 11.6 and 12. During the plating operation, this pH can be maintained by appropriate additions of aqueous sodium hydroxide to the solution.

The amounts of each ingredient in the electroless solution of Example 32 are not critical.

Suitable copper salt and reducing solutions are prepared in a manner identical with that set forth in Example 32 except that the amounts of each ingredient are varied as shown in Table IV.

TABLE IV [1]

| Component | Lower limit | Upper limit |
|---|---|---|
| Copper sulphate pentahydrate | 165 | 175 |
| Formaldehyde (37%) | [2] 1,880 | [2] 1,900 |
| Nickel chloride hexahydrate | 63 | 72 |
| Sodium hydroxide | 152 | 162 |
| Rochelle salts | 695 | 710 |
| Sodium carbonate | 68 | 77 |

[1] All amounts are in grams of component per gallon of water in the respective copper salt and reducing solutions.
[2] Cc. of component per gallon of water.

The electroless copper solutions can be stabilized by adding thereto an effective amount of the stabilizing compositions of this invention.

Examples 33 through 35 will illustrate typical stabilized compositions and techniques for their stabilization.

EXAMPLE 33

The electroless copper solution of Example 32 is stabilized with the additive composition of Example 1 as follows:

64 gallons of the electroless copper solution of Example 32 is prepared by mixing 8 gallons of the copper salt solution, 8 gallons of the reducing solution, and 48 gallons of distilled water. This aqueous composition is introduced into a 100-gallon plating tank. To this, there is added 64 cc. of the stabilizing composition of Example 1. The pH of the solution is maintained between 11.60 and 11.90 by use of 4 molar sodium hydroxide. The stabilized composition is then used to autocatalytically metalize a suitable substrate. After the bath has been used for 24 hours, an additional 4 cc. of the stabilizing composition of Example 1 are added thereto. Thereafter, 4 cc. of the stabilizer of Example 1 are added to the bath each 24 hours. The bath is used with excellent results for 11 days. The copper coatings formed are bright, level, and well adhered to the surface of the substrate.

Although the amount of additive composition used is not critical, there appears to be no particular advantage in deviating substantially from 1 cc. of additive per gallon of electroless solution in the initial make-up. After the bath has been used for a period of time, an additional amount of stabilizer may be added. The later additions may be in small daily increments, such as 4 cc., or larger amounts added at longer intervals.

EXAMPLE 34

The additive composition of Example 8 can be used to stabilize the electroless working solution of Example 32 as follows:

8 gallons of the copper salt solution, 8 gallons of the reducing solution, and 48 gallons of distilled water are mixed together to produce 64 gallons of the electroless working solution of Example 32. This composition is then introduced into a 100-gallon plating tank. To this, there is added 64 cc. of the stabilizing composition of Example 8. The stabilized bath is then used to coat 10-inch square glass plates with copper. After 3 days of continuous use, an additional 4 cc. of the stabilizing agent is added to the bath. The bath is operated continuously for 7 days, at which time the solution is depleted of copper which must be replenished.

To determine the worth of the additive of Example 8, a control bath, not containing the additive of Example 8 is prepared. After continuous use, under conditions identical with those employed with the stabilized bath, the control bath is depleted of copper after 6 hours.

The amount of the additive of the composition of Example 8 which is used, is not critical. Tests conducted with as little as 4 drops of additive per gallon of electroless solution show a substantial increase in the stability of the solution. Although there is no particular advantage in using more than 1 cc. of additive per gallon of working solution, tests have been conducted with as much as 5 cc. of additive per gallon. The rate of deposition of copper and the stability of the solution is essentially the same as when 1 cc. per gallon is used.

EXAMPLE 35

The electroless plating solution of Example 32 can be satisfactorily stabilized with the composition of Example 15. 64 gallons of the electroless plating solution are prepared by mixing 8 gallons of the copper salt solution, 8 gallons of the reducing solution, nad 48 gallons of distilled water. This aqueous composition is introduced into a 100-gallon copper plating tank. To the solution there is added 8 cc. of the addition agent of Example 15. The pH of the solution is maintained between 11.60 and 11.95 by the addition of appropriate amounts of 4 molar sodium hydroxide solution. The bath temperature is kept between 66 and 70° F. Every 24 hours, an additional 2 cc. of the stabilizing agent of Example 15 is added to the bath. The bath is used for 26 days to cover over 3,000 square feet of a non-conducting substance. The coating operation was conducted for 64½ hours.

The stabilized electroless solutions, as exemplified in Examples 33 through 35, can be used to coat a wide variety of substrates with copper. Due to the stability of the solutions, and the high quality of the films deposited, the process of coating with these solutions is commercially attractive. Both conductive and non-conductive substrates may be coated. Thus, such substrates as glass, synthetic resins, laminated paper, and metal clad substrates such as an epoxy glass laminate having a copper foil adhered thereto may be used. These compositions are particularly useful in the formation of plated through holes.

The coating process using the compositions of this invention will now be described with particular reference to the compositions of Examples 33 through 35. It is to be expressly understood that the method of this invention is not limited to the use of these compositions but encompasses using any of the foregoing stabilized electroless copper plating solutions.

Figure 2:
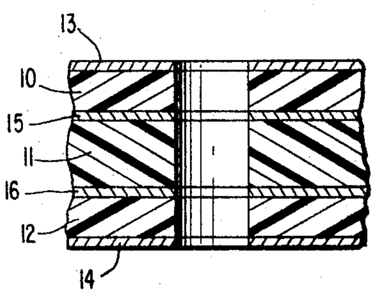
FIG. 2 is a cross-sectional view of a multi-planar printed circuit board.

The particular substrate with which the coating process will be described, is a multi-planar printed circuit board. This board is comprised of a stack of insulative sheets having desired conductor configurations or surfaces which become interior in the composite board. A suitable composite board is shown in FIGURE 1. FIGURE 1 illustrates three insulating sheets 10, 11 and 12. Preferably, these are formed of epoxy glass laminates. Sheets 10 and 12 have continuous conductive layers 13 and 14 on their outer surfaces. Sheet 11 has conductive pattern 15 on its upper surface. Not shown in FIGURE 1 is conductive pattern 16 (FIGURE 2) on the lower surface of sheet 11. Conductive patterns 15 and 16 are formed by laminating sheet 11 to a foil of copper and then etching away the copper to produce the desired configuration. Sheets 10, 11 and 12 are then laminated together to form composite board as shown in FIGURE 2. A hole is then drilled through the composite board. It is this composite board, having either one or a multiplicity of through holes, which is to be plated in this illustrative process.

Figure 3:
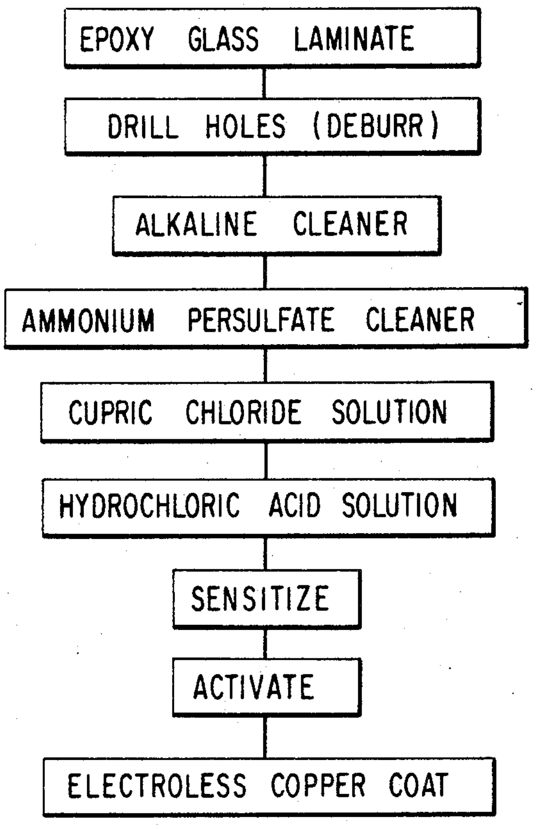
FIG. 3 is a flow diagram of the process of this invention.

FIGURE 3 is a flow diagram of the present process indicating the principal steps in the deposition of an electroless copper film.

Briefly, the process comprises, cleaning the composite board by immersing it in an alkaline cleaner and an ammonium persulphate cleaner. The board is then immersed in a cupric chloride solution, and a dilute aqueous hydrochloric acid solution. Following this, the substrate is sensitized by immersing it in a suitable solution and then it is acitvated after this preparatory treatment, the composite board is immersed in the stabilized electroless copper solution. After the copper film has been autocatalytically deposited in the electroless copper bath, the electroless copper film may then be over-plated with another metal, such as copper, by a conventional electrolytic technique.

In greater detail, the laminated boards are first cleaned by immersion in a series of cleaning solutions. The board is dipped in a solution containing from 5.5 to 6.5 ounces of Pennsalt K–2 in a gallon of tap water. The board remains in this solution for approximately 2 minutes. After this time, the board is rinsed with tap water and then immersed in a solution containing approximately 2 pounds of ammonium persulphate per gallon of water. The temperature of this solution is between 60–80° F. The board remains in the ammonium persulphate solution for approximately 30 seconds. The board is then rinsed in tap water and immersed in an aqueous hydrochloric acid solution of cupric chloride for approximately 30 seconds. A typical cupric chloride solution contains 115 grams of reagent grade cupric chloride dihydrate, ⅓ of a gallon of reagent grade concentrated hydrochloric acid, and 1 gallon of tap water. After the cupric chloride dip, the boards are again rinsed with tap water and then immersed, for approximately 1 minute, in a 25% by volume solution of hydrochloric acid in water. The boards are again rinsed with water and are now ready to be sensitized.

The sensitizing treatment can be performed in a variety of media. A preferred sensitizing solution is an aqueous composition containing 160–165 grams of stannous chloride dihydrate, 170–175 cc. of reagent grade hydrochloric acid, and 1 gallon of distilled water. This sensitizing solution should be maintained at a temperature of from 70–80° F. The cleaned board will be immersed in this solution for from 5 to 7 minutes. Various other sensitizing media may be used. Thus, it is contemplated that the boards may be sensitized by immersing them in the following types of solutions: an aqueous hydrochloric acid solution of titanium trichloride; an aqueous ammonium hydroxide solution of silver nitrate; an aqueous solution of ethanol and sodium hydroxide; an aqueous solution of hydroquinone and ethanol; and an aqueous composition of stannous fluoroborate and free fluoroboric acid.

Following the sensitizing treatment, the boards are again rinsed in tap water and then immersed in an activating solution. The purpose of the activating treatment is to deposit a film of a seeding metal onto the board. The preferred activating solutions will deposit either gold, silver, or palladium. A particularly preferable activating composition is prepared by adding 0.3 to 2 grams of palladium chloride dihydrate, dissolved in a gallon of distilled or deionized water, to 40 to 160 cc. of concentrated reagent grade hydrochloric acid. This activating solution will be maintained at a temperature of from 70 to 80° F. When this activating solution is used, the sensitized board will be immersed in the solution for from 2 to 4 minutes, which is sufficient to deposit a thin film of palladium metal onto the board. The thin palladium film acts as a catalyst, accelerating the deposition of metallic copper from the electroless solution.

The sensitized boards are then thoroughly rinsed in water and then immersed in the electroless copper solution. It is preferable to allow the board to remain in the stabilized electroless solution for approximately 20 minutes. Longer periods of time are unnecessary. Because of their stability, annd the quality of the copper films which they produce, the stabilized electroless coppering solutions specified in Examples 34, 35 and 36 may be used at this stage of the process with excellent results.

The essential steps in the above process are the deposition of the thin film of catalytic metal followed by the immersion in the stabilized electroless solution. As the electroless solution containing the additive is stable over long periods of time, the cost of the autocatalytic deposition process is reduced since fewer chemicals are needed, the bath requires less maintenance, and several processing steps required by the prior art are eliminated. Furthrmore, the electroless deposit is improved.

Following the completion of the electroless coating process, the boards may then be subjected to a conventional electrolytic copper plating process. This will develop a thicker coating of metallic copper over the electroless deposit. Following the electrolytic coating, the multi-planar printed circuit boards may then have their exterior surfaces etched away to leave any desired copper configuration on the surface. A small land area of conductive copper may be left surrounding the hole on the two exterior surfaces of the board. Alternatively, a circuit pattern of copper may be formed on the exterior surfaces by etching away the undesired material.

The multi-planar printed circuits thus fabricated may be used as is. However, the plated through holes may have applied to them an overcoating of a tin-lead alloy or of metallic tin. This is desirable for subsequent soldering and for some end uses.

Although the composite multi-planar printed circuit shown in FIGURES 1 and 2 is a three-ply laminate, containing two internal circuit planes, a greater number of circuit planes may be used. Thus, it is contemplated to form the composite board from as many as ten or eleven copper clad glass sheets. By doing this, the space required to package complicated circuit configurations can be substantially reduced.

By using the additive compositions of this invention, in conjunction with well known electroless copper plating solutions, a reliable, inexpensive, and relatively trouble-free method of autocatalytically forming metallic copper films is provided.

Although the invention has been described in detail and with reference to a number of specific examples, those skilled in the art will realize that numerous modifications may be made in the compositions and methods without departing from the spirit of the invention as expressed in the following claims.

What is claimed is:

1. A composition for stabilizing electroless copper plating solutions and improving the quality of deposited copper films comprising: a wetting agent, a compound selected from the group consisting of alkali metal carbonates and alkali metal bicarbonates, an alkali metal thiosulphate, an alkali metal thiocyanate, and a sulphur containing compound selected from the group consisting of thiourea, water soluble mercaptans and base soluble mercaptans, said mercaptans also being stable in aqueous base.

2. The composition of claim 1, wherein said wetting agent is the neutral sodium salt of a condensed organic acid.

3. The composition of claim 1, wherein said sulphur containing compound is thiourea.

4. The composition of claim 1, wherein said sulphur containing compound is 2,5-dimercapto 1,3,4-thiadiazole.

5. The composition of claim 1, wherein said sulphur containing compound is 8-mercaptopurine and the composition further contains thiomalic acid.

6. A composition for stabilizing electroless copper plating solutions and improving the brightness and quality of autocatalytically deposited copper films comprising: a wetting agent, a carbonate compound selected from the group consisting of sodium carbonate and potassium carbonate, sodium thiosulphate, sodium thiocyanate, and an organic sulphur compound selected from the group consisting of thiourea, 2,5-dimercapto 1,3,4-thiadiazole, 8-mercaptopurine and thiomalic acid.

7. A composition for stabilizing electroless copper plating solutions and improving the brightness of autocatalytically deposited copper films comprising: an aqueous solution containing 1 to 2 grams per liter of sodium carbonate, 1 to 1.5 grams per liter of sodium thiosulphate pentahydrate, 1 to 1.20 grams per liter of sodium thiocyanate, 0.002 to 0.005 gram per liter of 2,5-dimercapto 1,3,4-thiadiazole and a wetting agent.

8. A composition for stabilizing electroless copper plating solutions and improving the brightness and quality of autocatalytically deposited copper films comprising: an aqueous solution containing 1 to 2 grams per liter of sodium carbonate, 1 to 1.2 grams per liter of sodium thiosulphate pentahydrate, 1 to 1.2 grams per liter of sodium thiocyanate, 0.009 to 0.015 gram per liter of thiourea, and a wetting agent.

9. A composition for stabilizing electroless copper plating solutions and improving the brightness and quality of autocatalytically deposited copper films comprising: an aqueous solution containing 1.25 to 1.30 grams per liter of $K_2CO_3 \cdot 1\frac{1}{2}H_2O$, 1.25 to 1.30 grams per liter of sodium thiosulphate pentahydrate, 1.25 to 1.30 grams per liter of sodium thiocyanate, 0.0013 to 0.0015 gram per liter of 8-mercaptopurine, 0.0013 to 0.0015 gram per liter of thiomalic acid, and a wetting agent.

10. An aqueous composition for the electroless deposition of copper films comprising: a copper salt, a reducing agent for said copper salt, water and a minor but effective amount of stabilizing composition as defined in claim 1.

11. An aqueous composition for autocatalytically depositing bright copper films comprising: cupric sulphate, formaldehyde, nickel chloride, a copper complexing agent, sodium hydroxide, sodium carbonate, water and a minor but effective amount of a stabilizing composition as defined in claim 7.

12. An aqueous composition for autocatalytically depositing bright copper films comprising: cupric sulphate, formaldehyde, nickel chloride, a copper complexing agent, sodium hydroxide, sodium carbonate, water and a minor but ecective amount of a stabilizing composition as defined in claim 8.

13. An aqueous composition for autocatalytically depositing bright copper films comprising: cupric sulphate, formaldehyde, nickel chloride, a copper complexing agent, sodium hydroxide, sodium carbonate, water and a minor but effective amount of a stabilizing composition as defined in claim 9.

14. A composition for stabilizing electroless copper plating solutions and improving the quality of deposited copper films comprising: a compound selected from the group consisting of alkali metal carbonates and alkali metal bicarbonates, an alkali metal thiocyanate, and a sulphur containing compound selected from the group consisting of thiourea, water soluble mercaptans and base soluble mercaptans, said mercaptans also being stable in aqueous base.

15. A composition for stabilizing electroless copper plating solutions and improving the quality of deposited copper films comprising: a compound selected from the group consisting of alkali metal carbonates and alkali metal bicarbonates, an alkali metal thiosulphate, an alkali metal thiocyanate, and a sulphur containing compound selected from the group consisting of thiourea, water soluble mercaptans and base soluble mercaptans, said mercaptans also being stable in aqueous base.

16. A composition for stabilizing electroless copper plating solutions and improving the quality of deposited copper films comprising: a wetting agent, a compound selected from the group consisting of alkali metal carbonates and alkali metal bicarbonates, an alkali metal thiocyanate, and a sulphur containing compound selected from the group consisting of thiourea, water soluble mercaptans and base soluble mercaptans, said mercaptans also being stable in aqueous base.

References Cited

UNITED STATES PATENTS

| | | | |
|---|---|---|---|
| 2,454,610 | 11/1948 | Narcus | 117—213 |
| 2,874,072 | 2/1959 | Cahill et al. | 106—1 X |
| 3,093,509 | 6/1963 | Wein | 117—213 |
| 3,119,709 | 1/1964 | Atkinson | 106—1 X |
| 3,134,690 | 5/1964 | Ericksson | 117—213 |
| 3,222,195 | 12/1965 | Pearlstein | 106—1 |
| 3,257,215 | 6/1966 | Schneble et al. | 106—1 |

JULIUS FROME, *Primary Examiner.*

L. HAYES, *Assistant Examiner.*

U.S. Cl. X.R.

117—47, 54, 124, 130, 213